(12) United States Patent
Lin et al.

(10) Patent No.: US 9,496,233 B2
(45) Date of Patent: Nov. 15, 2016

(54) INTERCONNECTION STRUCTURE AND METHOD OF FORMING SAME (71) Applicant: Taiwan Semiconductor Manufacturing Company, Ltd., Hsin-Chu (TW)

(72) Inventors: Yu-Wei Lin, New Taipei (TW); Sheng-Yu Wu, Hsin-Chu (TW); (Continued)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/744,361

(22) Filed: Jan. 17, 2013

(65) Prior Publication Data
US 2014/0077360 A1 Mar. 20, 2014

Related U.S. Application Data (60) Provisional application No. 61/707,609, filed on Sep. 28, 2012, provisional application No. 61/707,442, (Continued)

(51) Int. Cl.
*H01L 23/00* (2006.01)
*H01L 21/768* (2006.01)
(Continued)

(52) U.S. Cl.
CPC ......... *H01L 24/13* (2013.01); *H01L 21/76885* (2013.01); *H01L 24/11* (2013.01);
(Continued)

(58) Field of Classification Search
None
See application file for complete search history.

(56) References Cited

U.S. PATENT DOCUMENTS 4,811,082 A 3/1989 Jacobs et al.
4,990,462 A 2/1991 Sliwa, Jr.
(Continued)

FOREIGN PATENT DOCUMENTS

CN 101080138 11/2007
CN 101188219 A 5/2008
(Continued)

OTHER PUBLICATIONS

Garrou, Phil, "IFTLE 58 Fine Pitch Microjoints, Cu Pillar Bump-on-Lead, Xillinx Interposer Reliability," Solid State Technology, Insights for Electronic Manufacturing, Jul. 18, 2011, 3 pages.

*Primary Examiner* — Whitney T Moore
*Assistant Examiner* — Scott R Wilson
(74) *Attorney, Agent, or Firm* — Slater Matsil, LLP (57) ABSTRACT

An embodiment bump on trace (BOT) structure includes a contact element supported by an integrated circuit, an under bump metallurgy (UBM) feature electrically coupled to the contact element, a metal ladder bump mounted on the under bump metallurgy feature, the metal ladder bump having a first tapering profile, and a substrate trace mounted on a substrate, the substrate trace having a second tapering profile and coupled to the metal ladder bump through direct metal-to-metal bonding. An embodiment chip-to-chip structure may be fabricated in a similar fashion.

20 Claims, 5 Drawing Sheets (72) Inventors: Yu-Jen Tseng, Hsin-Chu (TW);
Tin-Hao Kuo, Hsin-Chu (TW);
Chen-Shien Chen, Zhubei (TW)

Related U.S. Application Data filed on Sep. 28, 2012, provisional application No. 61/707,644, filed on Sep. 28, 2012, provisional application No. 61/702,624, filed on Sep. 18, 2012.

(51) Int. Cl.
*H01L 21/48* (2006.01)
*H01L 23/498* (2006.01)

(52) U.S. Cl.
CPC ............ *H01L 24/16* (2013.01); *H01L 24/81* (2013.01); *H01L 21/4853* (2013.01); *H01L 23/49811* (2013.01); *H01L 24/14* (2013.01); *H01L 2224/1112* (2013.01); *H01L 2224/11013* (2013.01); *H01L 2224/11462* (2013.01); *H01L 2224/11472* (2013.01); *H01L 2224/13015* (2013.01); *H01L 2224/13017* (2013.01); *H01L 2224/13023* (2013.01); *H01L 2224/1357* (2013.01); *H01L 2224/1369* (2013.01); *H01L 2224/13082* (2013.01); *H01L 2224/13083* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13551* (2013.01); *H01L 2224/13565* (2013.01); *H01L 2224/13582* (2013.01); *H01L 2224/13686* (2013.01); *H01L 2224/14051* (2013.01); *H01L 2224/16227* (2013.01); *H01L 2224/16238* (2013.01); *H01L 2224/16503* (2013.01); *H01L 2224/81007* (2013.01); *H01L 2224/8181* (2013.01); *H01L 2224/8192* (2013.01); *H01L 2224/81191* (2013.01); *H01L 2224/81424* (2013.01); *H01L 2224/81439* (2013.01); *H01L 2224/81444* (2013.01); *H01L 2224/81447* (2013.01); *H01L 2924/07025* (2013.01); *H01L 2924/181* (2013.01); *H01L 2924/301* (2013.01); *Y10T 29/49144* (2015.01)

(56) References Cited

U.S. PATENT DOCUMENTS

| | | |
|---|---|---|
| 5,075,253 A | 12/1991 | Sliwa, Jr. |
| 5,075,965 A | 12/1991 | Carey et al. |
| 5,130,779 A | 7/1992 | Agarwala et al. |
| 5,277,756 A | 1/1994 | Dion |
| 5,334,804 A | 8/1994 | Love et al. |
| 5,380,681 A | 1/1995 | Hsu |
| 5,431,328 A | 7/1995 | Chang et al. |
| 5,440,239 A | 8/1995 | Zappella et al. |
| 5,470,787 A | 11/1995 | Greer |
| 5,481,133 A | 1/1996 | Hsu |
| 5,508,561 A | 4/1996 | Tago et al. |
| 5,542,601 A | 8/1996 | Fallon et al. |
| 5,587,337 A | 12/1996 | Idaka et al. |
| 5,680,187 A | 10/1997 | Nagayama et al. |
| 5,790,377 A | 8/1998 | Schreiber et al. |
| 5,796,591 A | 8/1998 | Dalal et al. |
| 5,816,478 A | 10/1998 | Kaskoun et al. |
| 5,889,326 A | 3/1999 | Tanaka |
| 5,977,599 A | 11/1999 | Adrian |
| 6,002,172 A | 12/1999 | Desai et al. |
| 6,002,177 A | 12/1999 | Gaynes et al. |
| 6,025,650 A | 2/2000 | Tsuji et al. |
| 6,082,610 A | 7/2000 | Shangguan et al. |
| 6,091,141 A | 7/2000 | Heo |
| 6,130,476 A | 10/2000 | LaFontaine, Jr. et al. |
| 6,137,184 A | 10/2000 | Ikegami |
| 6,181,010 B1 | 1/2001 | Nozawa |
| 6,187,678 B1 | 2/2001 | Gaynes et al. |
| 6,229,216 B1 | 5/2001 | Ma et al. |
| 6,229,220 B1 | 5/2001 | Saitoh et al. |
| 6,236,115 B1 | 5/2001 | Gaynes et al. |
| 6,249,051 B1 | 6/2001 | Chang et al. |
| 6,250,541 B1 | 6/2001 | Shangguan et al. |
| 6,271,059 B1 | 8/2001 | Bertin et al. |
| 6,279,815 B1 | 8/2001 | Correia et al. |
| 6,291,891 B1 | 9/2001 | Higashi et al. |
| 6,346,469 B1 | 2/2002 | Greer |
| 6,355,501 B1 | 3/2002 | Fung et al. |
| 6,358,847 B1 | 3/2002 | Li et al. |
| 6,424,037 B1 | 7/2002 | Ho et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,492,197 B1 | 12/2002 | Rinne |
| 6,498,308 B2 | 12/2002 | Sakamoto |
| 6,562,653 B1 | 5/2003 | Ma et al. |
| 6,562,657 B1 | 5/2003 | Lin |
| 6,570,248 B1 | 5/2003 | Ahn et al. |
| 6,573,598 B2 | 6/2003 | Ohuchi et al. |
| 6,578,754 B1 | 6/2003 | Tung |
| 6,583,846 B1 | 6/2003 | Yanagawa et al. |
| 6,592,019 B2 | 7/2003 | Tung |
| 6,600,222 B1 | 7/2003 | Levardo |
| 6,607,938 B2 | 8/2003 | Kwon et al. |
| 6,661,085 B2 | 12/2003 | Kellar et al. |
| 6,713,844 B2 | 3/2004 | Tatsuta |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,940,169 B2 | 9/2005 | Jin et al. |
| 6,940,178 B2 | 9/2005 | Kweon et al. |
| 6,943,067 B2 | 9/2005 | Greenlaw |
| 6,946,384 B2 | 9/2005 | Kloster et al. |
| 6,972,490 B2 | 12/2005 | Chang et al. |
| 6,975,016 B2 | 12/2005 | Kellar et al. |
| 6,998,216 B2 | 2/2006 | He et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,135,766 B1 | 11/2006 | Costa et al. |
| 7,151,009 B2 | 12/2006 | Kim et al. |
| 7,157,787 B2 | 1/2007 | Kim et al. |
| 7,192,803 B1 | 3/2007 | Lin et al. |
| 7,215,033 B2 | 5/2007 | Lee et al. |
| 7,245,023 B1 | 7/2007 | Lin |
| 7,251,484 B2 | 7/2007 | Aslanian |
| 7,271,483 B2 | 9/2007 | Lin et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,382,049 B2 | 6/2008 | Ho et al. |
| 7,402,442 B2 | 7/2008 | Condorelli et al. |
| 7,402,508 B2 | 7/2008 | Kaneko |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,459,785 B2 | 12/2008 | Daubenspeck et al. |
| 7,470,996 B2 | 12/2008 | Yoneyama et al. |
| 7,494,845 B2 | 2/2009 | Hwang et al. |
| 7,495,179 B2 | 2/2009 | Kubota et al. |
| 7,528,494 B2 | 5/2009 | Furukawa et al. |
| 7,531,890 B2 | 5/2009 | Kim |
| 7,554,201 B2 | 6/2009 | Kang et al. |
| 7,557,597 B2 | 7/2009 | Anderson et al. |
| 7,576,435 B2 | 8/2009 | Chao |
| 7,659,631 B2 | 2/2010 | Kamins et al. |
| 7,804,177 B2 | 9/2010 | Lu et al. |

(56) References Cited

U.S. PATENT DOCUMENTS

| | | |
|---|---|---|
| 7,834,450 B2 | 11/2010 | Kang |
| 7,946,331 B2 | 5/2011 | Trezza et al. |
| 8,076,232 B2 | 12/2011 | Pendse |
| 8,093,729 B2 | 1/2012 | Trezza |
| 8,120,175 B2 | 2/2012 | Farooq et al. |
| 8,130,475 B2 | 3/2012 | Kawamori et al. |
| 8,158,489 B2 | 4/2012 | Huang et al. |
| 8,207,604 B2 | 6/2012 | Haba et al. |
| 8,232,640 B2 | 7/2012 | Tomoda et al. |
| 8,258,055 B2 | 9/2012 | Hwang et al. |
| 8,435,881 B2 | 5/2013 | Choi et al. |
| 9,105,530 B2 | 8/2015 | Lin et al. |
| 2001/0013423 A1 | 8/2001 | Dalal et al. |
| 2001/0038147 A1 | 11/2001 | Higashi et al. |
| 2002/0033412 A1 | 3/2002 | Tung |
| 2002/0084528 A1 | 7/2002 | Kim et al. |
| 2002/0100974 A1 | 8/2002 | Uchiyama |
| 2002/0106832 A1 | 8/2002 | Hotchkiss et al. |
| 2002/0197811 A1 | 12/2002 | Sato |
| 2003/0092219 A1 | 5/2003 | Ouchi et al. |
| 2003/0218250 A1 | 11/2003 | Kung et al. |
| 2004/0140538 A1 | 7/2004 | Harvey |
| 2004/0159944 A1 | 8/2004 | Datta et al. |
| 2004/0212098 A1 | 10/2004 | Pendse |
| 2005/0062153 A1 | 3/2005 | Saito et al. |
| 2005/0212114 A1 | 9/2005 | Kawano et al. |
| 2005/0224991 A1 | 10/2005 | Yeo |
| 2005/0253264 A1 | 11/2005 | Aiba et al. |
| 2006/0012024 A1 | 1/2006 | Lin et al. |
| 2006/0038303 A1 | 2/2006 | Sterrett et al. |
| 2006/0051954 A1 | 3/2006 | Lin et al. |
| 2006/0055032 A1 | 3/2006 | Chang et al. |
| 2006/0076677 A1 | 4/2006 | Daubenspeck et al. |
| 2006/0209245 A1 | 9/2006 | Mun et al. |
| 2006/0223313 A1 | 10/2006 | Yoon et al. |
| 2006/0292824 A1 | 12/2006 | Beyne et al. |
| 2007/0001280 A1 | 1/2007 | Hua |
| 2007/0012337 A1 | 1/2007 | Hillman et al. |
| 2007/0018294 A1 | 1/2007 | Sutardja |
| 2007/0020906 A1 | 1/2007 | Chiu et al. |
| 2007/0023483 A1* | 2/2007 | Yoneyama et al. ........ 228/110.1 |
| 2007/0045840 A1 | 3/2007 | Varnau |
| 2007/0057022 A1 | 3/2007 | Mogami et al. |
| 2007/0114663 A1* | 5/2007 | Brown .................. H01L 24/02 257/737 |
| 2007/0200234 A1 | 8/2007 | Gerber et al. |
| 2008/0003402 A1 | 1/2008 | Haba et al. |
| 2008/0023850 A1 | 1/2008 | Lu et al. |
| 2008/0128911 A1 | 6/2008 | Koyama |
| 2008/0150135 A1 | 6/2008 | Oyama et al. |
| 2008/0180376 A1 | 7/2008 | Kim et al. |
| 2008/0194095 A1* | 8/2008 | Daubenspeck ..... H01L 23/3192 438/612 |
| 2008/0218061 A1 | 9/2008 | Chao et al. |
| 2008/0277785 A1 | 11/2008 | Hwan et al. |
| 2009/0025215 A1 | 1/2009 | Murakami et al. |
| 2009/0042144 A1 | 2/2009 | Kitada et al. |
| 2009/0075469 A1 | 3/2009 | Furman et al. |
| 2009/0096092 A1 | 4/2009 | Patel |
| 2009/0108443 A1 | 4/2009 | Jiang |
| 2009/0149016 A1* | 6/2009 | Park ........................ H01L 24/11 438/614 |
| 2009/0166861 A1* | 7/2009 | Lehr et al. ..................... 257/737 |
| 2009/0174067 A1 | 7/2009 | Lin |
| 2009/0218702 A1 | 9/2009 | Beyne et al. |
| 2009/0250814 A1 | 10/2009 | Pendse et al. |
| 2010/0007019 A1 | 1/2010 | Pendse |
| 2010/0044860 A1 | 2/2010 | Haba et al. |
| 2010/0141880 A1 | 6/2010 | Koito et al. |
| 2010/0193944 A1* | 8/2010 | Castro ..................... H01L 24/16 257/737 |
| 2010/0200279 A1* | 8/2010 | Kariya .................. H01L 21/486 174/255 |
| 2010/0252926 A1 | 10/2010 | Kato et al. |
| 2010/0276787 A1 | 11/2010 | Yu et al. |
| 2010/0314745 A1* | 12/2010 | Masumoto ........ H01L 23/49811 257/692 |
| 2010/0327422 A1 | 12/2010 | Lee et al. |
| 2011/0001250 A1 | 1/2011 | Lin et al. |
| 2011/0024902 A1 | 2/2011 | Lin et al. |
| 2011/0169158 A1 | 7/2011 | Varanasi |
| 2011/0177686 A1 | 7/2011 | Zeng et al. |
| 2011/0186986 A1 | 8/2011 | Chuang et al. |
| 2011/0193220 A1 | 8/2011 | Kuo et al. |
| 2011/0244675 A1 | 10/2011 | Huang et al. |
| 2011/0260317 A1 | 10/2011 | Lu et al. |
| 2011/0285011 A1 | 11/2011 | Hwang et al. |
| 2011/0285023 A1 | 11/2011 | Shen et al. |
| 2012/0007230 A1 | 1/2012 | Hwang et al. |
| 2012/0007231 A1 | 1/2012 | Chang |
| 2012/0012997 A1 | 1/2012 | Shen et al. |
| 2012/0040524 A1 | 2/2012 | Kuo et al. |
| 2012/0049346 A1 | 3/2012 | Lin et al. |
| 2012/0091577 A1 | 4/2012 | Hwang et al. |
| 2012/0098120 A1 | 4/2012 | Yu et al. |
| 2012/0146168 A1 | 6/2012 | Hsieh et al. |
| 2012/0306080 A1 | 12/2012 | Yu et al. |
| 2013/0026622 A1 | 1/2013 | Chuang et al. |
| 2013/0087920 A1* | 4/2013 | Jeng et al. ..................... 257/773 |
| 2013/0093079 A1 | 4/2013 | Tu et al. |
| 2013/0270699 A1* | 10/2013 | Kuo et al. ...................... 257/738 |
| 2013/0277830 A1 | 10/2013 | Yu et al. |
| 2013/0288473 A1 | 10/2013 | Chuang et al. |
| 2014/0054764 A1 | 2/2014 | Lu et al. |
| 2014/0061897 A1 | 3/2014 | Lin et al. |
| 2014/0061924 A1 | 3/2014 | Chen et al. |
| 2014/0077358 A1 | 3/2014 | Chen et al. |
| 2014/0077360 A1 | 3/2014 | Lin et al. |
| 2014/0077365 A1 | 3/2014 | Lin et al. |
| 2014/0264890 A1 | 9/2014 | Breuer et al. |
| 2014/0353820 A1 | 12/2014 | Yu et al. |

FOREIGN PATENT DOCUMENTS

| | | |
|---|---|---|
| CN | 102254871 A | 11/2011 |
| CN | 102468197 | 5/2012 |
| EP | 1387402 A2 | 2/2004 |
| KR | 1020110002816 A | 1/2011 |
| KR | 1020110128532 A | 11/2011 |
| TW | 200826265 | 6/2008 |
| TW | 200915452 | 4/2009 |
| TW | 201133662 | 10/2011 |
| TW | 201143007 | 12/2011 |

* cited by examiner

INTERCONNECTION STRUCTURE AND METHOD OF FORMING SAME

CROSS-REFERENCE TO RELATED APPLICATIONS

This application claims the benefit of U.S. Provisional Application No. 61/707,609, filed on Sep. 28, 2012, entitled "Interconnection Structure Method of Forming Same," of U.S. Provisional Application No. 61/707,644, filed on Sep. 28, 2012, entitled "Metal Bump and Method of Manufacturing Same," of U.S. Provisional Application No. 61/702,624, filed on Sep. 18, 2012, entitled "Ladd Bump Structures and Methods of Making the Same," and of U.S. Provisional Application No. 61/707,442, filed on Sep. 28, 2012, entitled "Bump Structure and Method of Forming Same," which applications are hereby incorporated herein by reference.

BACKGROUND

Generally, the conventional flip chip bumps have vertical or nearly vertical sidewalls and are connected to an underlying trace (such as on a substrate, a printed circuit board, an interposer, another chip, or the like) using a solder reflow process.

The solder joint method forms intermetallic compounds (IMCs) between the metal-solder interface. The IMCs may cause higher electrical resistivity (contact resistance). The higher electrical resistivity leads to increased electromigration, which further increases the contact resistance. In addition, with a small area under bump metallurgy (UBM), the solder/metal electromigration issue may be of greater concern.

As device packaging dimensions shrink, the smaller distance between the bump and an adjacent trace may lead to undesirable bridging during reflow. In addition, as device packaging dimensions shrink interconnect bump sizes also shrink. The reduction in bump size has led to an increase in interconnect resistance and capacitance (RC) that is the cause of signal transmission delay (RC delay). Smaller bump sizes also increases the risk of extremely low-k (ELK) dielectric delamination.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a ladder bump structure for a bump on trace (BOT) assembly or a flip-chip chip scale package (FCCSP). The concepts in the disclosure may also apply, however, to other semiconductor structures or circuits.

Figure 1:
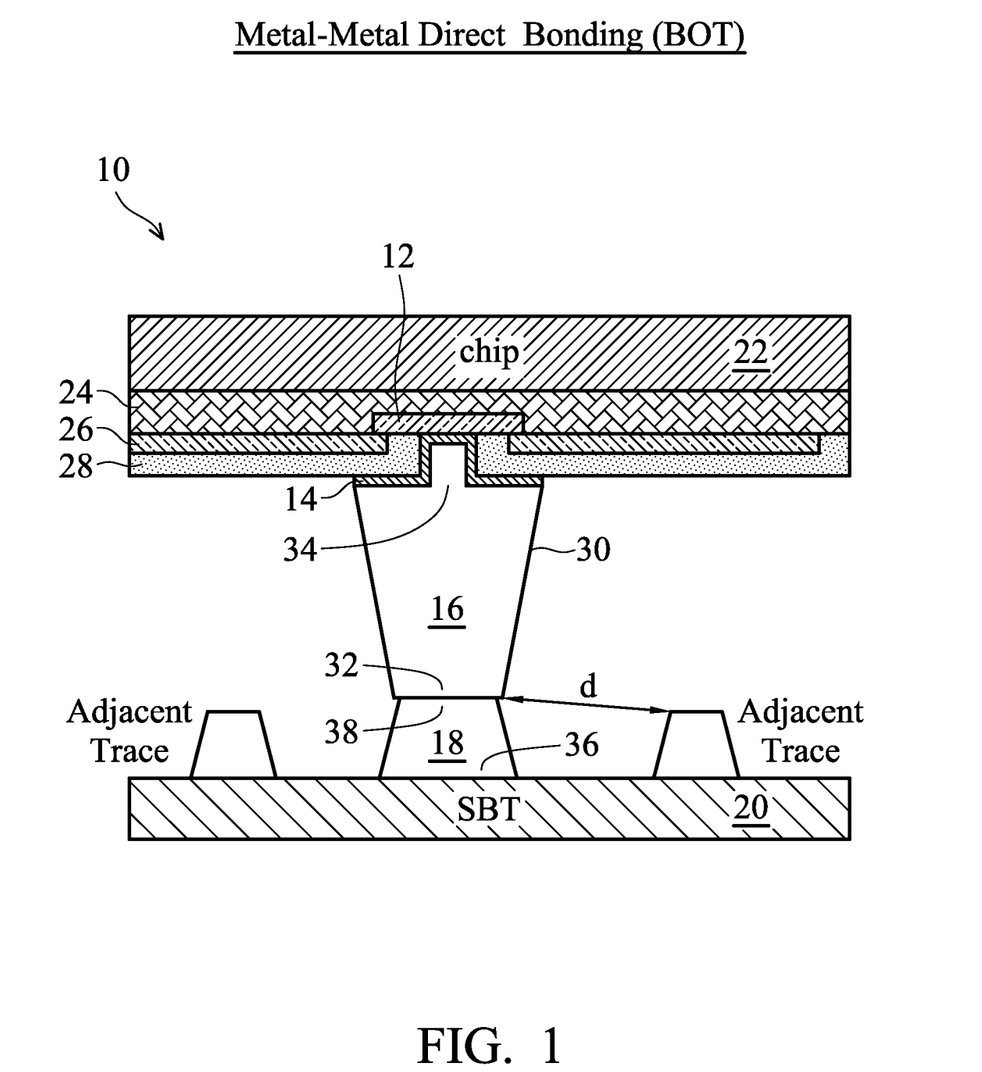
FIG. 1 is a cross sectional view of an embodiment bump on trace (BOT) structure.

Referring now to FIG. 1, an embodiment bump on trace (BOT) structure 10 is illustrated. As shown, the BOT structure 10 includes a contact element 12, an under bump metallurgy (UBM) feature 14, a metal ladder bump 16, a substrate trace 18, and a substrate 20. As shown, the contact element 12 is generally supported by the integrated circuit 22 (i.e., chip). In an embodiment, an insulating layer 24 is disposed between the contact element 12 and the integrated circuit 22. In an embodiment, the contact element 12 is an aluminum pad. In an embodiment, the insulating layer 24 comprises an extremely low-k (ELK) dielectric.

In an embodiment, a passivation layer 26 overlies the integrated circuit 22 (and/or the insulating layer 24). As shown in FIG. 1, the passivation layer 26 may have a passivation opening exposing the contact element 12. In an embodiment, a polyimide layer 28 overlies the passivation layer 26. The polyimide layer 28 may have a polyimide opening exposing the contact element 12.

Various layers and features of the integrated circuit 22, including transistors, interconnect layers, post passivation interconnects, redistribution layers, and the like are omitted from the figures for the sake of clarity, as they are not necessary to an understanding of the present disclosure.

Still referring to FIG. 1, the UBM feature 14 is electrically coupled to the contact element 12. In an embodiment, the UBM feature 14 is formed from titanium (Ti), titanium nitride (TiN) copper nickel (CuNi), aluminum (Al), and the like to a thickness of, perhaps, about 0.1 µm to about 5 µm, depending on the application. As shown, various layers including, for example, a passivation layer and a polyimide layer, may be disposed between portions of the UBM feature 14 and the contact element 12.

Still referring to FIG. 1, the metal ladder bump 16 is mounted on the UBM feature 14. In an embodiment, the metal ladder bump 16 has a tapering profile. In an embodiment, the metal ladder bump 16 has a linear tapering profile. Indeed, the metal ladder bump 16 generally has the shape of a truncated cone. In an embodiment, sidewalls 30 of the metal ladder bump 16 are linear from a distal end 32 to a mounted end 34 of the metal ladder bump 16 along an entire height (i.e., or length) of the sidewalls 30 of the metal ladder bump 16.

In an embodiment, the metal ladder bump 16 is formed from a suitable material such as, for example, copper (Cu), nickel (Ni), gold (Au), palladium (Pd), titanium (Ti), and so on, or alloys thereof. The mounted end 34 of the metal ladder bump 16, which is the end closest to the integrated circuit 22, has a greater width than the distal end 32 of the metal ladder bump 16, which is the end furthest from the integrated circuit 22. In an embodiment, the distal end 32 has a width of between about 10 µm to about 80 µm. In an embodiment, the mounted end 34 has a width of between about 20 µm to about 90 µm.

From the foregoing, it should be recognized that the mounted end 34 is wider or larger than the distal end 32. This condition may be satisfied by, for example, making the mounted end 34 of the metal ladder bump 16 larger relative to the distal end 32. This condition may also be satisfied by, for example, making the distal end 32 of the metal ladder bump 16 smaller relative to the mounted end 34.

One skilled in the art will recognize that it is not desirable to increase the pitch between adjacent bumps. This means that the width of the distal end 32 should not be increased beyond design dimensions. Hence, in order to get the truncated cone structure for the metal ladder bump 16, the width of the mounted end 34 should be increased in order to obtain the advantageous structure. The wider width of the mount end 34 may also serve to lessen the possibility of delamination between the metal ladder bump 16 and adjacent layers and may also serve to lessen stress impact on underlying layers such as underlying ELK layers (e.g., insulating layer 24). As shown in FIG. 1, by forming the distal end 32 of the metal ladder bump 16 smaller than the mounted end 34, the distance, d, between the adjacent trace 18 and the bonded substrate trace 18/metal bump 16 is greater to prevent bridging.

In an embodiment, a photolithography process is used to shape the metal ladder bump 16 as shown in FIG. 1. Indeed, in the photolithography process a photoresist may be shaped appropriately in order to produce the metal ladder bump 16 in the form illustrated in FIG. 1. In an embodiment, the metal ladder bump 16 and/or the substrate trace 18 may be formed using an electrolytic plating process.

Still referring to FIG. 1, the substrate trace 18 is generally mounted on the substrate 20. In an embodiment, the substrate trace 18 is formed from copper (Cu), nickel (Ni), gold (Au), aluminum (Al), silver (Ag), and so on, or alloys thereof. As shown, the substrate trace 18 also has a tapering profile. Indeed, a mounted end 36 of the substrate trace 18, which is the end mounted to the substrate 20, has a greater width than a distal end 38 of the substrate trace 18, which is the end furthest from the substrate 20.

In addition to the above, the substrate trace 18 is structurally and electrically coupled to the metal ladder bump 16 through direct metal-to-metal bonding. Indeed, ends of the metal ladder bump 16 and the substrate trace 18 are each free of solder. Because direct metal-to-metal bonding is used instead of solder, the metal ladder bump 16 is operably coupled to the substrate trace without forming any undesirably intermetallic compounds at or proximate the bonded joint. In addition, the absence of solder reduces the potential for undesirably bridging of the substrate trance 18 and/or the metal ladder bump 16 with an adjacent substrate trace 18.

In an embodiment, the direct metal-to-metal bonding process includes several steps. For example, the top portions or surfaces of the metal ladder bump 16 and/or substrate trace 18 are appropriately cleaned to remove debris or contaminants that may detrimentally affect bonding or bonding strength. Thereafter, the metal ladder bump 16 and the substrate trace 18 are aligned with each other. Once aligned, a permanent bonding process such as, for example, a thermo-compression bonding is performed to bond the metal ladder bump 16 to the substrate trace 18. In an embodiment, an annealing step may be performed to increase the bond strength. For example, the metal ladder bump 16 and the substrate trace 18 may be subjected to a temperature of about 100° C. to about 400° C. for about 1 hour to about 2 hours.

Figure 2:
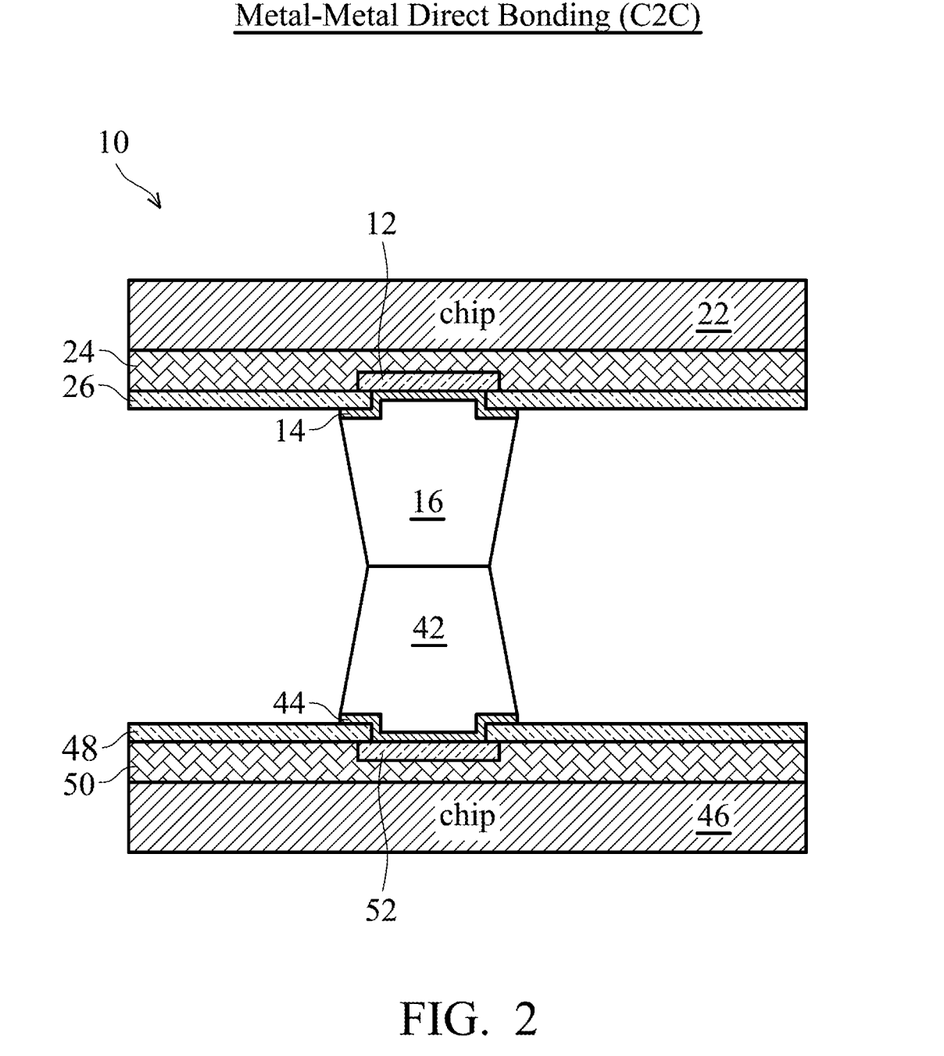
FIG. 2 is a cross sectional view of an embodiment chip-to-chip structure.

Referring now to FIG. 2, an embodiment chip-to-chip structure 40 is illustrated. The chip-to-chip structure 40 is similar to the BOT structure 10 of FIG. 1. However, the chip-to-chip structure 40 of FIG. 2 includes a second metal ladder bump 42 mounted on a second UBM feature 44 of a second integrated circuit 46 instead of the substrate trace 18 on the substrate 20. As shown, the second metal ladder bump 42 also has a tapering profile and is structurally and electrically coupled to the first metal ladder bump 16 through direct metal-to-metal bonding.

In an embodiment, the second integrated circuit 46 includes a second passivation layer 48, a second insulating layer 50 (e.g., ELK dielectric), and a second contact element 52 (e.g., aluminum pad). Various layers and features of the second integrated circuit 46, including transistors, interconnect layers, post passivation interconnects, redistribution layers, and the like are omitted from the figures for the sake of clarity, as they are not necessary to an understanding of the present disclosure. In addition, the second metal ladder bump 16 may be formed in similar fashion and with similar dimensions relative to the metal ladder bump 16 of FIG. 1.

Figure 3:
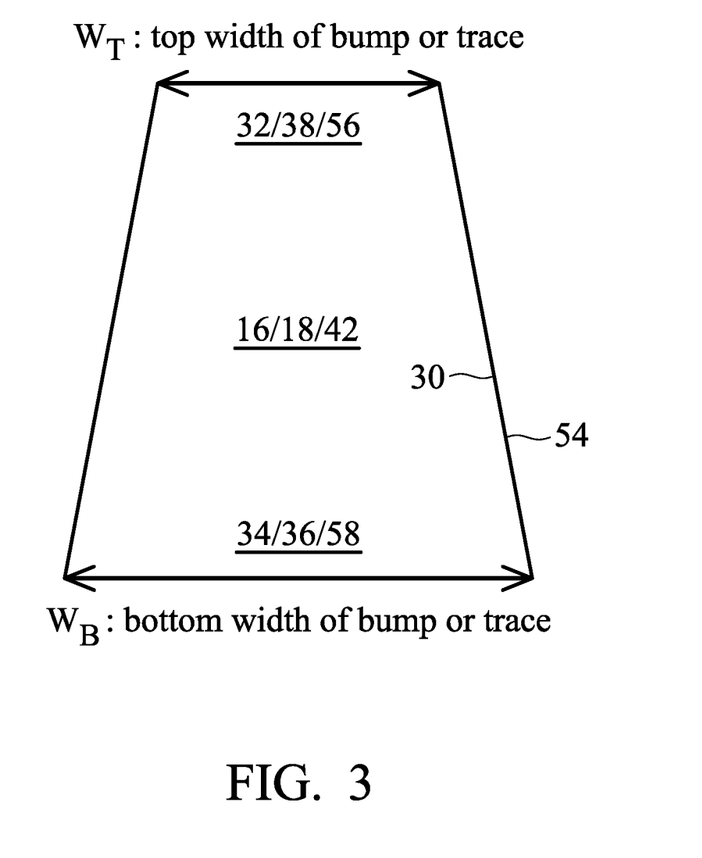
FIG. 3 is a cross section of a metal bump from the BOT structure of FIG. 1 or the chip-to-chip structure of FIG. 2 illustrating a tapering profile and a metal oxide formed on sidewalls.

As shown in FIG. 3, in an embodiment a metal oxide 54 (e.g., cupric oxide, CuO, cuprous oxide, $Cu_2O$, aluminum oxide, $Al_2O_3$, etc.) is formed on the sidewalls 30 of the metal ladder bump 16, substrate trace 18, or second metal ladder bump 42. In an embodiment, a ratio of the width ($W_T$) of the distal end 32 of the metal ladder bump 16 to the width ($W_B$) of the mounted end 34 of the metal ladder bump 16 is between about 0.75 to about 0.97. In an embodiment, a ratio of the width ($W_T$) of the distal end 38 of the substrate trace 18 to the width ($W_B$) of the mounted end 36 of the substrate trace 18 is between about 0.75 to about 0.97. In an embodiment, a ratio of the width ($W_T$) of the distal end 56 of the second metal ladder bump 42 to the width ($W_B$) of the mounted end 58 of the second metal ladder bump 42 is between about 0.75 to about 0.97.

Figure 4:
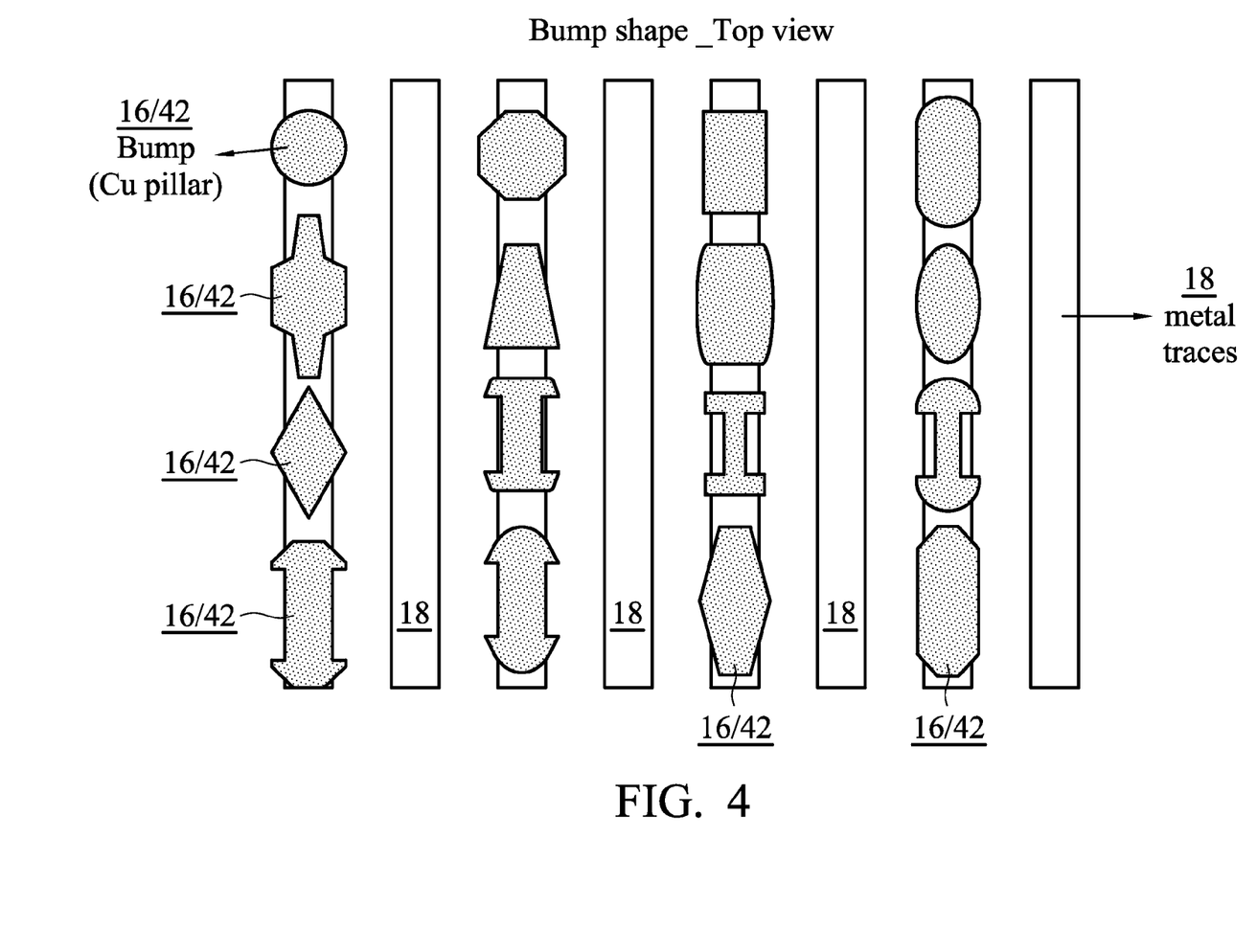
FIG. 4 is a plan view of the metal bump from the BOT structure of FIG. 1 or the chip-to-chip structure of FIG. 2 illustrating various periphery shapes.

As shown in FIG. 4, a periphery of the metal ladder bump 16 (or the second metal ladder bump 42) may take or resemble a variety of different shapes when viewed from above. In an embodiment, the metal ladder bump 16 (or the second metal ladder bump 42) is in the form of a circle, a rectangle, an ellipse, an obround, a hexagon, an octagon, a trapezoid, a diamond, a capsule, and combinations thereof when viewed from the mounted end 34, 58. In FIG. 4, the periphery of the metal ladder bump 16 (or the second metal ladder bump 42) is shown relative to the underlying metal substrate trace 18 (FIG. 1).

One skilled in the art will recognize that the specific dimensions for the various widths and spacing discussed herein are matters of design choice and are dependent upon the particular technology node, and application employed.

Figure 5:
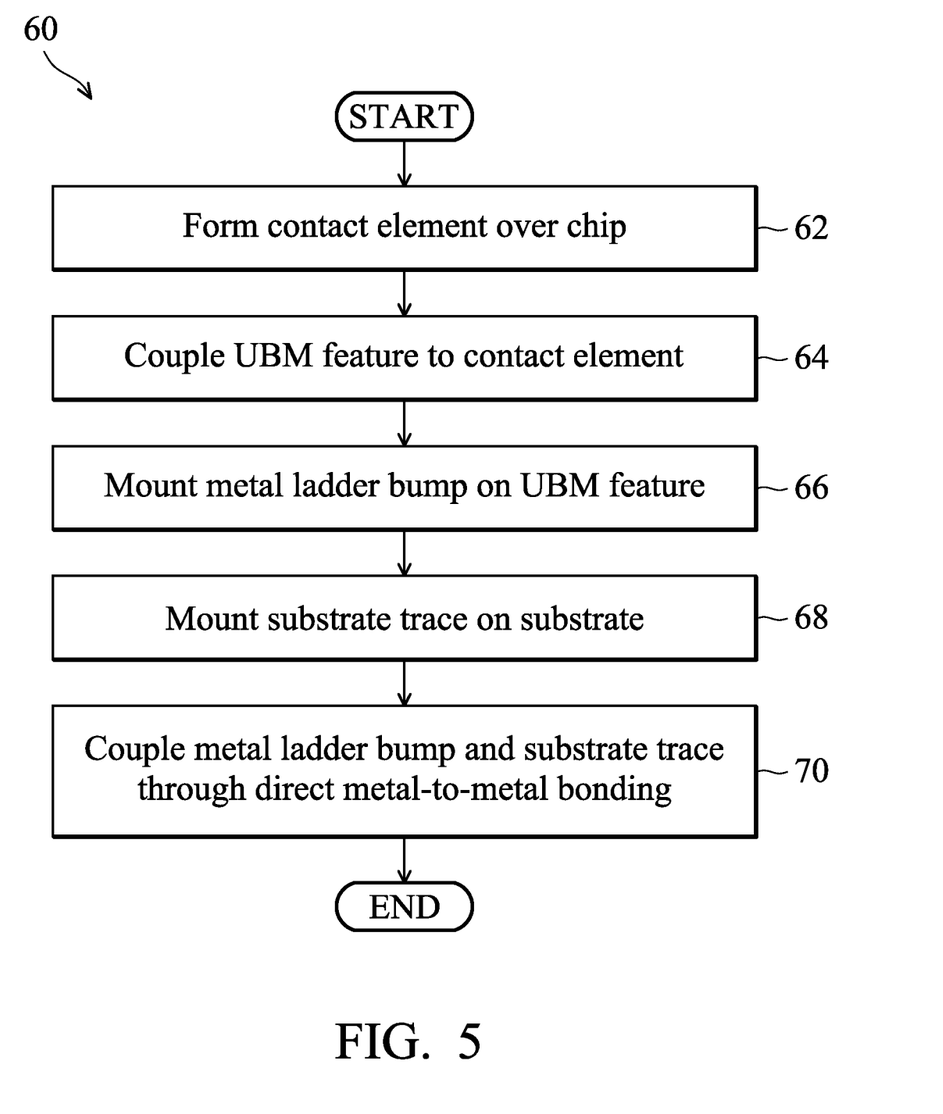
FIG. 5 is a method of forming the BOT structure of FIG. 1.

Referring now to FIG. 5, an embodiment method 60 of forming the BOT structure 10 of FIG. 1 is provided. In block 62, the contact element 12 is formed on the integrated circuit 22. In block 64, the UBM feature is electrically coupled to the contact element 12. Then, in block 66, the metal ladder bump 16 with the tapering profile is mounted on the UBM feature 14. In block 68, the substrate trace 18 with the tapering profile is mounted on the substrate 20. Thereafter, in block 70, the metal ladder bump 16 and the substrate trace 18 are coupled together through direct metal-to-metal bonding as described herein. Those skilled in the art will recognize that the chip-to-chip structure of FIG. 2 may be formed in similar fashion. Therefore, a detailed description of such a method has not been repeated herein for the sake of brevity.

From the foregoing it should be recognized that embodiment BOT structure 10 and chip-to-chip structure 40 provide advantageous features. For example, without having to rely on solder bonding, the BOT structure 10 and chip-to-chip structure 40 are free of any undesirably intermetallic compounds (IMCs). In addition, the BOT structure 10 and chip-to-chip structure 40 provide lower electrical resistivity, lower risk of electromigration failure, and a significantly reduced interconnect RC delay relative to conventional devices. Moreover, the structures 10, 40 inhibit or prevent delamination of the insulating layer 24, 46 (the ELK dielectric). In addition, the smaller top surface area of the metal ladder bump 16, substrate trace 18, and/or second metal ladder bump 42 provide for easier bonding. Still further, the bonding time and the interfacial seam voids may be reduced using the structures 10, 40 and methods disclosed herein.

The following references are related to subject matter of the present application. Each of these references is incorporated herein by reference in its entirety:

U.S. Publication No. 2011/0285023 of Shen, et al. filed on Nov. 24, 2011, entitled "Substrate Interconnections Having Different Sizes."

An embodiment bump on trace (BOT) structure includes a contact element supported by an integrated circuit, an under bump metallurgy (UBM) feature electrically coupled to the contact element, a metal ladder bump mounted on the under bump metallurgy feature, the metal ladder bump having a first tapering profile, and a substrate trace mounted on a substrate, the substrate trace having a second tapering profile and coupled to the metal ladder bump through direct metal-to-metal bonding.

An embodiment chip-to-chip structure includes a first contact element supported by a first integrated circuit, a first under bump metallurgy (UBM) feature electrically coupled to the first contact element, a first metal ladder bump mounted on the first under bump metallurgy feature, the first metal ladder bump having a first tapering profile, and a second metal ladder bump mounted on a second under bump metallurgy feature of a second integrated circuit, the second metal ladder bump having a second tapering profile and coupled to the second metal ladder bump through direct metal-to-metal bonding.

An embodiment method of forming a bump on trace (BOT) structure includes forming a contact element on an integrated circuit, electrically coupling an under bump metallurgy (UBM) feature to the contact element, mounting a metal ladder bump on the under bump metallurgy feature, the metal ladder bump having a first tapering profile, mounting a substrate trace on a substrate, the substrate trace having a second tapering profile, and coupling the metal ladder bump and the substrate trace together through direct metal-to-metal bonding.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bump on trace (BOT) structure, comprising:
an integrated circuit having a contact element;
an under bump metallurgy (UBM) feature electrically coupled to the contact element;
a metal ladder bump mounted on the under bump metallurgy feature, the metal ladder bump having a first tapering profile; and
a substrate trace mounted on a substrate, the substrate trace having a second tapering profile and coupled to the metal ladder bump through direct metal-to-metal bonding, wherein a first width of a distal end of the metal ladder bump is different than a second width of a distal end of the substrate trace, wherein the distal end of the metal ladder bump is relative to the integrated circuit, and wherein the distal end of the substrate trace is relative to the substrate, wherein the integrated circuit is coupled to the substrate trace without use of solder joints.

2. The structure of claim 1, wherein the metal ladder bump is coupled to the substrate trace without forming intermetallic compounds.

3. The structure of claim 1, wherein a distal end of the metal ladder bump and the substrate trace are each free of solder.

4. The structure of claim 1, wherein a third width of a mounted end of the metal ladder bump is greater than the first width of the distal end of the metal ladder bump.

5. The structure of claim 1, wherein a ratio of the first width of the distal end of the metal ladder bump to a third width of a mounted end of the metal ladder bump is between about 0.75 to about 0.97.

6. The structure of claim 1, wherein a ratio of the second width of the distal end of the substrate trace to a fourth width of a mounted end of the substrate trace is between about 0.75 to about 0.97.

7. The structure of claim 1, wherein the first tapering profile of the metal ladder bump is linear.

8. The structure of claim 1, wherein sidewalls of the metal ladder bump are coated with a metal oxide.

9. The structure of claim 1, wherein a periphery of the metal ladder bump resembles one of a circle, a rectangle, an ellipse, an obround, a hexagon, an octagon, a trapezoid, a diamond, a capsule, and combinations thereof when viewed from a mounted end.

10. The structure of claim 1, wherein a passivation layer overlies the integrated circuit, the passivation layer having a passivation opening exposing the contact element, and a polyimide layer overlies the passivation layer, the polyimide layer having a polyimide opening exposing the contact element.

11. The structure of claim 10, wherein an extremely low-k dielectric layer is interposed between at least one of the integrated circuit and the passivation layer and the integrated circuit and the contact element.

12. The structure of claim 1, wherein a first length of the distal end of the metal ladder bump is less than second length the distal end of the substrate trace, wherein the first width and the second width are measured along a first direction, wherein the first length and second length are measured along a second direction, and wherein the first direction is perpendicular to the second direction.

13. A chip-to-chip structure, comprising:
a first contact element supported by a first integrated circuit;
a first under bump metallurgy (UBM) feature electrically coupled to the first contact element;
a first metal ladder bump mounted on the first under bump metallurgy feature, the first metal ladder bump having a first tapering profile; and
a second metal ladder bump mounted on a second under bump metallurgy feature of a second integrated circuit, the second metal ladder bump having a second tapering profile and coupled to the first metal ladder bump through direct metal-to-metal bonding, wherein the first metal ladder bump and the second metal ladder bump each have a top width of a distal end to bottom width of a mounted end ratio of between about 0.75 to about 0.97, and wherein the first integrated circuit and the second integrated circuit are coupled without the use of solder joints.

14. The structure of claim 13, wherein the first metal ladder bump is coupled to the second metal ladder bump without forming intermetallic compounds.

15. The structure of claim 13, wherein a distal end of the first metal ladder bump and the second metal ladder bump are free of solder.

16. The structure of claim 13, wherein sidewalls of at least one of the first metal ladder bump and the second metal ladder bump are coated with a metal oxide.

17. A bump on trace (BOT) structure, comprising:
a contact element supported by an integrated circuit;
an under bump metallurgy (UBM) feature electrically coupled to the contact element;
a metal ladder bump mounted on the under bump metallurgy feature, the metal ladder bump having a first tapering profile; and
a substrate trace mounted on a substrate, the substrate trace having a second tapering profile, the substrate trace and the metal ladder bump mechanically and electrically coupled to each other through a direct metal-to-metal bond, the direct metal-to-metal bond free of solder, wherein a distal end of the metal ladder bump is different than a distal end of the substrate trace, wherein the distal end of the metal ladder bump is a furthest surface of the metal ladder bump from the integrated circuit, wherein the distal end of the substrate trace is a furthest surface of the substrate trace from the substrate, and wherein an angle formed by a sidewall of the metal ladder bump and a sidewall of the substrate trace at an interface between the metal ladder bump and the substrate trace is an obtuse angle.

18. The structure of claim 17, wherein a bottom width of the metal ladder bump is greater than a top width of the metal ladder bump.

19. The structure of claim 17, wherein a ratio of a top width of the metal ladder bump to a bottom width of the metal ladder bump is between about 0.75 to about 0.97 and a ratio of a top width of the substrate trace to a bottom width of the substrate trace is between about 0.75 to about 0.97.

20. The structure of claim 17, wherein the first tapering profile of the metal ladder bump is linear and sidewalls of the metal ladder bump are coated with a metal oxide.

* * * * *